US012593499B2

(12) United States Patent
Utsumi et al.

(10) Patent No.: US 12,593,499 B2
(45) Date of Patent: Mar. 31, 2026

(54) SILICON CARBIDE SEMICONDUCTOR DEVICE AND SILICON CARBIDE SEMICONDUCTOR SUBSTRATE

(71) Applicant: FUJI ELECTRIC CO., LTD., Kawasaki (JP)

(72) Inventors: Makoto Utsumi, Matsumoto-city (JP); Masaki Miyazato, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 414 days.

(21) Appl. No.: 18/454,147

(22) Filed: Aug. 23, 2023

(65) Prior Publication Data

US 2023/0395709 A1 Dec. 7, 2023

Related U.S. Application Data

(63) Continuation of application No. PCT/JP2022/026398, filed on Jun. 30, 2022.

(30) Foreign Application Priority Data

Sep. 3, 2021 (JP) ................................. 2021-144110

(51) Int. Cl.
*H10D 62/60* (2025.01)
*H10D 30/66* (2025.01)
(Continued)

(52) U.S. Cl.
CPC ......... *H10D 84/144* (2025.01); *H10D 30/668* (2025.01); *H10D 62/393* (2025.01); *H10D 62/8325* (2025.01)

(58) Field of Classification Search
CPC .... H10D 12/032; H10D 12/038; H10D 30/66; H10D 30/662; H10D 30/663;
(Continued)

(56) References Cited

U.S. PATENT DOCUMENTS

2008/0217627 A1* 9/2008 Friedrichs ................ H10D 8/00
257/77
2014/0291723 A1* 10/2014 Miyazaki ............. H10D 62/393
438/530
(Continued)

FOREIGN PATENT DOCUMENTS

JP 6351874 B2 7/2018
JP 2019102493 A 6/2019
(Continued)

OTHER PUBLICATIONS

International Search Report for International Application No. PCT/JP2022/026398, issued on Sep. 27, 2022.
(Continued)

*Primary Examiner* — Eric A. Ward
(74) *Attorney, Agent, or Firm* — Rabin & Berdo, P.C.

(57) ABSTRACT

First and second buffer regions and an n⁻-type drift region are sequentially formed by epitaxial growth on an n⁺-type starting substrate. An impurity concentration of the first buffer region is higher than that of the n⁻-type drift region and lower than that of the n⁺-type starting substrate. An impurity concentration of the second buffer region is higher than that of the first buffer region and continuously increases by a first impurity concentration gradient from a first gradient changing point toward the n⁻-type drift region to a second gradient changing point toward the first buffer region; continuously decreases by a second impurity concentration gradient from the first gradient changing point to a first interface; and continuously decreases by a third impurity concentration gradient from the second gradient changing point to a second interface. The second impurity concentration gradient is lower than the third impurity concentration gradient.

15 Claims, 3 Drawing Sheets

(51) Int. Cl.

H10D 62/17    (2025.01)
 H10D 62/832   (2025.01)
 H10D 84/00    (2025.01)

(58) Field of Classification Search

CPC .. H10D 30/664; H10D 30/665; H10D 30/667;
       H10D 30/668; H10D 30/669; H10D
                  62/8325

See application file for complete search history.

(56)      References Cited

U.S. PATENT DOCUMENTS

| | | | | |
|---|---|---|---|---|
| 2016/0322472 | A1* | 11/2016 | Schloegl | ............... H01L 21/265 |
| 2018/0082841 | A1 | 3/2018 | Tawara | |
| 2018/0166279 | A1* | 6/2018 | Tamura | ................... H10D 8/00 |
| 2019/0040545 | A1* | 2/2019 | Nakamura | ........ H01L 21/02529 |
| 2019/0165102 | A1 | 5/2019 | Fujimoto | |
| 2020/0006066 | A1 | 1/2020 | Konishi et al. | |
| 2023/0049926 | A1* | 2/2023 | Ganagona | ........... H10D 12/032 |

FOREIGN PATENT DOCUMENTS

| | | | |
|---|---|---|---|
| JP | 6627938 | B2 | 1/2020 |
| JP | 6729757 | B2 | 7/2020 |
| JP | 6791274 | B2 | 11/2020 |
| WO | 2017094764 | A1 | 6/2017 |
| WO | 2017104751 | A1 | 6/2017 |

OTHER PUBLICATIONS

Written Opinion for International Application No. PCT/JP2022/026398, issued on Sep. 27, 2022.

* cited by examiner

FIG.4

| SAMPLE NO. | FIRST BUFFER REGION | | SECOND BUFFER REGION | | EFFECT OF SUPPRESSION OF Von FLUCTUATION |
|---|---|---|---|---|---|
| | IMPURITY CONCENTRATION ($\times 10^{18}$/cm$^3$) | THICKNESS t1 (μm) | IMPURITY CONCENTRATION ($\times 10^{18}$/cm$^3$) | THICKNESS t2 (μm) | |
| 1 | 1 | 1 | 3 | 0 | × |
| 2 | 1 | 1 | 3 | 1 | △ |
| 3 | 1 | 1 | 3 | 2 | ○ |
| 4 | 1 | 1 | 3 | 4 | ○ |
| 5 | 1 | 1 | 3 | 6 | ○ |
| 6 | 1 | 1 | 0.5 | 2 | × |
| 7 | 1 | 1 | 1 | 2 | △ |
| 8 | 1 | 1 | 2 | 2 | △ |
| 9 | 1 | 1 | 5 | 2 | ○ |
| 10 | 1 | 1 | 8 | 2 | × |
| 11 | 0.5 | 1 | 2 | 2 | △ |
| 12 | 1.5 | 1 | 2 | 2 | ○ |
| 13 | 4 | 1 | 2 | 2 | × |
| 14 | 1 | 2 | 2 | 1 | △ |
| 15 | 1 | 4 | 2 | 1 | ○ |
| 16 | 1 | 6 | 2 | 1 | × |

SILICON CARBIDE SEMICONDUCTOR DEVICE AND SILICON CARBIDE SEMICONDUCTOR SUBSTRATE

CROSS REFERENCE TO RELATED APPLICATIONS

This is a continuation application of International Application PCT/JP2022/026398 filed on Jun. 30, 2022, which claims priority from a Japanese Patent Application No. 2021-144110 filed on Sep. 3, 2021, the contents of which are incorporated herein by reference.

BACKGROUND OF THE INVENTION

1. Field of the Invention

Embodiments of the invention relate to a silicon carbide semiconductor device and a silicon carbide semiconductor substrate.

2. Description of the Related Art

Conventionally, in a metal oxide semiconductor field effect transistor (SiC-MOSFET) containing silicon carbide (SiC) as a semiconductor material and having an insulated gate with a metal-oxide film-semiconductor three-layer structure, a semiconductor chip is used in which epitaxial layers constituting an $n^-$-type drift region and a p-type base region are sequentially formed by epitaxial growth on an $n^+$-type starting substrate containing silicon carbide. In epitaxial layers the of the semiconductor chip, basal plane dislocations (BPDs) occur due to process damage and/or propagation from the starting substrate during epitaxial growth.

When a parasitic diode (body diode) formed by a pn junction between the p-type base region formed in the epitaxial layer and the $n^-$-type drift region conducts, stacking faults grow (expand) in the epitaxial layer, forming a high-resistance layer, whereby the flow of current is inhibited and thus, the on-voltage of the MOSFET increases. Stacking faults are presumed to be caused by a recombination of minority carriers (holes), which are injected into the $n^-$-type drift region due to bipolar operation of the body diode, and electrons near BPDs, which are origins of stacking faults. Thus, by disposing an n-type buffer region (epitaxial layer) between the starting substrate and the $n^-$-type drift region, the amount of holes that reach the BPDs from the pn junction decreases and the growth of stacking faults is suppressed.

As for a conventional SiC-MOSFET, a device has been proposed that has a two-layer structure in which buffer regions having impurity concentrations and thicknesses different from each other are provided (for example, refer to International Publication No. WO 2017/104751, Japanese Patent No. 6627938, and Japanese Patent No. 6729757). In International Publication No. WO 2017/104751, Japanese Patent No. 6627938, and Japanese Patent No. 6729757, the buffer region is of an n-type and has a two-layer structure in which the impurity concentration is lower and the thickness is thinner closer to the $n^+$-type starting substrate than to the $n^-$-type drift region, whereby the impurity concentration of the $n^+$-type buffer region (second buffer region) relatively close to the $n^-$-type drift region is substantially the same as that of the $n^+$-type starting substrate and an effect of suppressing the growth of stacking faults is increased and measurement of the thickness of the second buffer region by Fourier transform using infrared light reflected at an interface between the second buffer region and the n-type buffer region (first buffer region) relatively close to the $n^+$-type starting substrate is possible.

Further, International Publication No. WO 2017/104751, Japanese Patent No. 6627938, and Japanese Patent No. 6729757 disclose that the impurity concentration of the $n^+$-type starting substrate is in a range of $1\times10^{18}$/cm$^3$ to $2\times10^{19}$/cm$^3$; the impurity concentration of the first buffer region is ⅓ or less of the impurity concentration of the $n^+$-type starting substrate or the second buffer region and preferably may be in a range of $1\times10^{17}$/cm$^3$ to $1\times10^{18}$/cm$^3$ while preferably, the thickness of the first buffer region may be in a range of 0.1 µm to 5 µm and more preferably may be at least 1 µm; the impurity concentration of the second buffer region is at least three times the impurity concentration of the first buffer region and is about the same as that of the $n^+$-type starting substrate while the thickness of the second buffer region is at least 3 µm; and the impurity concentration of the $n^-$-type drift region is lower than the impurity concentrations of the first and second buffer regions.

Further, as another conventional silicon carbide semiconductor device, a device has been proposed in which a buffer region has a stacked structure of two or more layers of differing impurity concentrations (for example, refer to Japanese Patent No. 6351874, Japanese Patent No. 6791274). In Japanese Patent No. 6351874, the impurity concentration of the first buffer region near the $n^+$-type starting substrate is lower than the impurity concentration of the $n^+$-type starting substrate, whereby BPDs propagated from the $n^+$-type starting substrate have a relatively high probability of transforming into a threading edge dislocation (TED) in the first buffer region. The impurity concentration of the second buffer region is higher than the impurity concentrations of the $n^+$-type starting substrate, the first buffer region, and the $n^-$-type drift region, whereby generation of new crystal defects in the $n^-$-type drift region is suppressed.

Japanese Patent No. 6351874 discloses that the impurity concentration of the $n^+$-type starting substrate is in a range of $5\times10^{17}$/cm$^3$ to $1\times10^{19}$/cm$^3$; the impurity concentration of the first buffer region is lower than the impurity concentration of the $n^+$-type starting substrate and is in a range of $5\times10^{16}$/cm$^3$ to $1\times10^{19}$/cm$^3$; the thickness of the first buffer region is 500 nm; the impurity concentration of the second buffer region is higher than the impurity concentration of the $n^+$-type starting substrate and in a range of $5\times10^{18}$/cm$^3$ to $2\times10^{19}$/cm$^3$; the thickness of the second buffer region is 1 µm; the impurity concentration of the $n^-$-type drift region is lower than the impurity concentration of the first buffer region and in a range of $1\times10^{14}$/cm$^3$ to $5\times10^{16}$/cm$^3$; and the thickness of the $n^-$-type drift region is 10 µm.

Further, Japanese Patent No. 6351874 discloses that a buffer region in which the impurity concentration continuously varies in a depth direction is disposed between the $n^+$-type starting substrate and the first buffer region, between the first buffer region and the second buffer region, and between the second buffer region and the $n^-$-type drift region, and variation of the impurity concentration at each of the interfaces is set so as to vary gradually, whereby generation of crystal defects is further suppressed. Japanese Patent No. 6351874 discloses that between the second buffer region and the $n^-$-type drift region, a buffer region having a thickness of about 10 µm and in which the impurity concentration per 1 µm of the thickness in a direction to the interface thereof with the $n^-$-type drift region from the interface thereof with the second buffer region is reduced by about $2\times10^{18}$/cm$^3$ is disposed, whereby the impurity concentration at the interface between the buffer region and the n$^-$-type drift region is gradual.

In Japanese Patent No. 6791274, the impurity concentration of the first buffer region relatively close to the n$^+$-type starting substrate is lower than the impurity concentration of the n$^+$-type starting substrate, whereby the probability of transformation of BPDs propagated from the n$^+$-type starting substrate into TEDs in the first buffer region becomes relatively high. The impurity concentration of the second buffer region is higher than the impurity concentration of the first buffer region, whereby a depletion layer that spreads from a pn junction between the p-type base region and the n$^-$-type drift region is stopped by the second buffer region. Further, the buffer region in which the impurity concentration continuously increases from the interface thereof with the n$^+$-type starting substrate to the interface thereof with the first buffer region is disposed between the n$^+$-type starting substrate and the first buffer region, whereby BPDs at the interface between the buffer region and the first buffer region easily transform into TEDs.

Japanese Patent No. 6791274 discloses that the impurity concentration of the n$^+$-type starting substrate is greater than $1\times10^{18}$/cm$^3$ but not more than $1\times10^{19}$/cm$^3$; the impurity concentration of the first buffer region is greater than $1\times10^{16}$/cm$^3$ but not more than $1\times10^{17}$/cm$^3$; the thickness of the first buffer region is a few hundred nm; the impurity concentration of the second buffer region is at least $1\times10^{17}$/cm$^3$ but less than $1\times10^{19}$/cm$^3$; the thickness of the second buffer region is in a range of 0.5 μm to 8 μm; the impurity concentration of the n$^-$-type drift region is at least $1\times10^{14}$/cm$^3$ but less than $5\times10^{16}$/cm$^3$; the thickness of the n$^-$-type drift region is in a range of 3 μm to 80 μm; and normally, the impurity concentration of the first buffer region is lower than the impurity concentrations of the n$^+$-type starting substrate and the second buffer region and higher than the impurity concentration of the n$^-$-type drift region.

SUMMARY OF THE INVENTION

According to an embodiment of the present invention, a silicon carbide semiconductor device includes: a semiconductor substrate in which an epitaxial layer is epitaxially grown on a starting substrate containing silicon carbide, and a current flows through the semiconductor substrate in a direction orthogonal to a first main surface of the semiconductor substrate; a first semiconductor region of a first conductivity type, provided in the epitaxial layer; a second semiconductor region of the first conductivity type, provided in the epitaxial layer between the first semiconductor region and the starting substrate, the second semiconductor region being in contact with the starting substrate and having an impurity concentration that is higher than an impurity concentration of the first semiconductor region and lower than an impurity concentration of the starting substrate; and a third semiconductor region of the first conductivity type, provided in the epitaxial layer between the first semiconductor region and the second semiconductor region, the third semiconductor region being in contact with the first semiconductor region and the second semiconductor region and having an impurity concentration that is higher than the impurity concentration of the second semiconductor region and lower than the impurity concentration of the starting substrate. The impurity concentration of the third semiconductor region: continuously increases by a first impurity concentration gradient from a first depth position that is relatively close to a first interface between the third semiconductor region and the first semiconductor region to a second depth position that is relatively close to a second interface between the second semiconductor region and the third semiconductor region, and has a maximum impurity concentration at the second depth position, continuously decreases by a second impurity concentration gradient from the first depth position to the first interface, and continuously decreases by a third impurity concentration gradient from the second depth position to the second interface. The second impurity concentration gradient is lower than the third impurity concentration gradient.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a graph depicting the relationship between the impurity concentrations and the thickness of the first and second buffer regions and the on-voltage Von in an experimental example.

DETAILED DESCRIPTION OF THE INVENTION

Figure 1:
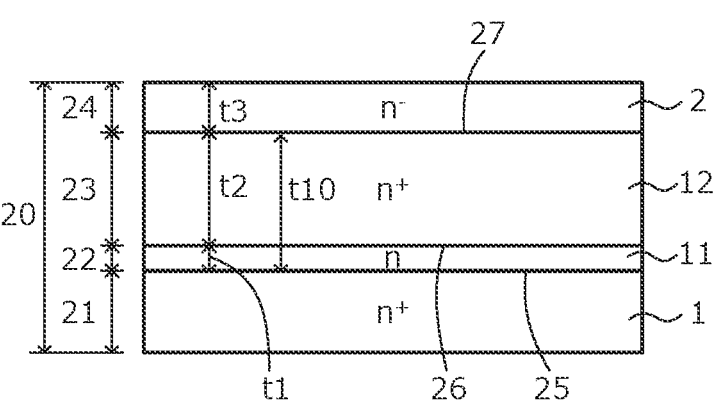
FIG. 1 is a cross-sectional view depicting a structure of a silicon carbide semiconductor substrate according to an embodiment.

First, problems associated with the conventional techniques are discussed. In the conventional silicon carbide semiconductor substrate, the impurity concentration of the second buffer region (buffer region relatively closer to the n$^-$-type drift region) is relatively high, whereby a difference in the impurity concentrations of the second buffer region and the n$^-$-type drift region increases and thus, lattice defects easily occur close to the interface between the second buffer region and the n$^-$-type drift region and the reliability of the silicon carbide semiconductor substrate decreases. Further, the higher is the impurity concentration of the second buffer region, the poorer is the controllability of the impurity concentration of the epitaxial growth of the second buffer region and variation of the impurity concentration of the second buffer region in the depth direction increases, whereby on-voltage of the silicon carbide semiconductor substrate varies and the reliability decreases.

Embodiments of a silicon carbide semiconductor device and a silicon carbide semiconductor substrate according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 2:
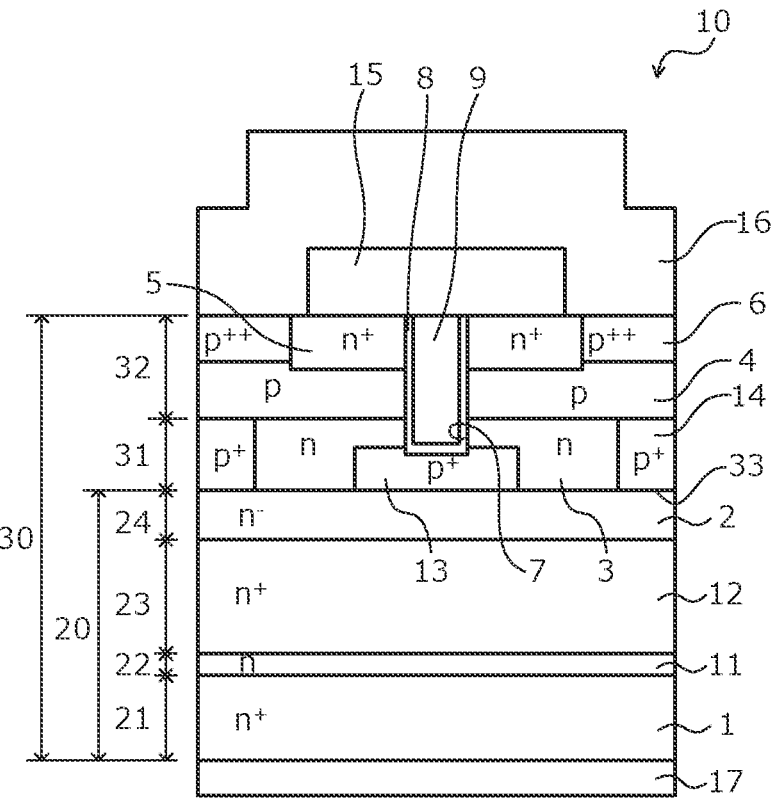
FIG. 2 is a cross-sectional view depicting a structure of a silicon carbide semiconductor device according to the embodiment.
Figure 3:
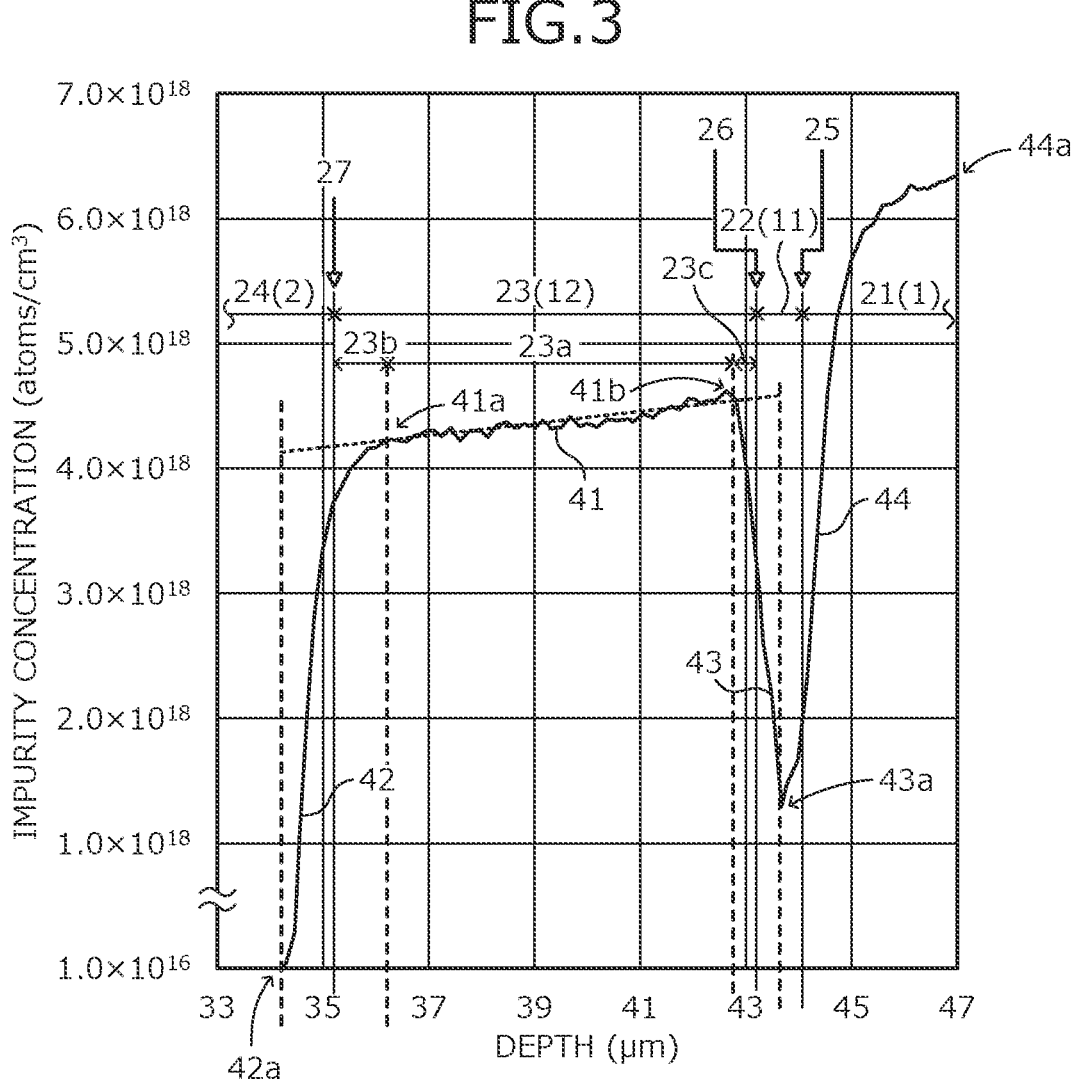
FIG. 3 is a characteristics diagram depicting impurity concentration distribution of first and second buffer regions in FIG. 1.

A structure of a silicon carbide semiconductor device according to an embodiment is described. FIGS. 1 and 2 are cross-sectional views depicting a structure of a silicon carbide semiconductor substrate and the silicon carbide semiconductor device according to the embodiment. FIG. 3 is a characteristics diagram depicting impurity concentration distribution of first and second buffer regions in FIG. 1. FIG. 3 depicts an instance in which a target thickness t1 of a first buffer region 11 is assumed to be 1 μm and a target thickness t2 of a second buffer region 12 is assumed to be 7 μm. Further, in FIG. 3, the impurity concentration distribution in a vicinity of each main surface of a silicon carbide semiconductor substrate 20 is not depicted and only respective portions (vicinities of interfaces 25, 27 of first and second buffer regions 11, 12) of an n$^+$-type starting substrate 21 and an n$^-$-type drift region 2 are depicted.

The silicon carbide semiconductor substrate 20 according to the embodiment depicted in FIG. 1 is an epitaxial substrate in which, for example, multiple epitaxial layers 22, 23, 24 of an n-type, each doped with an n-type impurity such as nitrogen (N) and having a different impurity concentration are sequentially stacked on a front surface of the n$^+$-type starting substrate 21, which contains silicon carbide (SiC) as a semiconductor material and is suitable for fabrication (manufacture) of a vertical silicon carbide semiconductor device through which current flows in a direction orthogonal to a main surface of a semiconductor substrate (semiconductor chip) such as in, for example, a SiC-MOSFET (FIG. 2), a p-intrinsic-n (pin) diode (not depicted), and the like. In an instance in which a SiC-MOSFET is fabricated using the silicon carbide semiconductor substrate 20, the n$^+$-type starting substrate 21 constitutes an n$^+$-type drain region 1. In an instance in which a pin diode is fabricated using the silicon carbide semiconductor substrate 20, the n$^+$-type starting substrate 21 constitutes an n$^+$-type cathode region.

An impurity concentration of the n$^+$-type starting substrate 21 is, for example, in a range of about $1.0 \times 10^{18}$/cm$^3$ to $1.0 \times 10^{19}$/cm$^3$. The epitaxial layers 22 to 24 constitute, respectively, a first buffer region (n-type buffer region: second semiconductor region) 11, a second buffer region (n$^+$-type buffer region: third semiconductor region) 12, and an n$^-$-type drift region (first semiconductor region) 2. An impurity concentration of the n-type epitaxial layer 22 (the first buffer region 11) is lower than impurity concentrations of the n$^+$-type starting substrate 21 and the n$^+$-type epitaxial layer 23 (the second buffer region 12) and higher than an impurity concentration of the n$^-$-type epitaxial layer 24 (the n$^-$-type drift region 2). The impurity concentration of the first buffer region 11 is, for example, in a range of about $0.5 \times 10^{18}$/cm$^3$ to $1.5 \times 10^{18}$/cm$^3$.

Preferably, the thickness t1 of the first buffer region 11 may be, for example, greater than about 1 μm but not more than 4 μm. When the thickness t2 of the second buffer region 12 is greater than 1 μm, the thickness t1 of the first buffer region 11 may be about 1 μm or less. The first buffer region 11 has a function of transforming BPDs propagated from the n$^+$-type starting substrate 21 during epitaxial growth of the epitaxial layers 22 to 24 and later-described epitaxial layers 31, 32 (refer to FIG. 2) into TEDs. Further, measurement of the thickness of the second buffer region 12 (refer to International Publication No. WO 2017/104751, Japanese Patent No. 6627938, and Japanese Patent No. 6729757) by a Fourier transform using infrared light reflected by a surface (interfaces 25, 26) of the first buffer region 11 is possible.

The second buffer region 12 has a function of reducing the amount of holes that reach a BPD that is closer to the n$^+$-type starting substrate 21 than is the second buffer region 12; the second buffer region 12 traps minority carriers (holes) at an interface of a pn junction (for example, a pn junction 33 between a later-described p-type base region 4, p$^+$-type regions 13, 14, n-type current spreading regions 3, and the n$^-$-type drift region 2, refer to FIG. 2) that constitutes a main junction, when current passes through the pn junction in a forward direction and thereby causes the carriers to disappear by recombing with majority carriers (electrons). Thus, the second buffer region 12 is provided between the n$^-$-type drift region 2 and the n$^+$-type starting substrate 21, whereby the growth of stacking faults over time due to use of the SiC-MOSFET may be suppressed.

An impurity concentration of the second buffer region 12 is lower than the impurity concentration of the n$^+$-type starting substrate 21 and about ½ or less of the impurity concentration of the n$^+$-type starting substrate 21. In particular, the impurity concentration of the second buffer region 12 is, for example, in a range of about $1.0 \times 10^{18}$/cm$^3$ to $5.0 \times 10^{18}$/cm$^3$ and preferably, may be in a range of about $3.0 \times 10^{18}$/cm$^3$ or less. The impurity concentration of the second buffer region 12 is within the range described, whereby the impurity concentration of the second buffer region 12 may be controlled to be about ±10% with respect to a target impurity concentration. Thus, as compared to the conventional structure in which the impurity concentration of the second buffer region exceeds the upper limit of the range described, the control of the impurity concentration of the epitaxial growth of the second buffer region 12 is enhanced.

Further, the second buffer region 12 has a first portion 23$a$ of a predetermined depth range occupying a majority of the thickness t2 of the second buffer region 12, a second portion 23$b$ relatively close to the n$^-$-type drift region 2, and a third portion 23$c$ relatively close to the n$^+$-type starting substrate 21 (relatively close to the first buffer region 11), and the impurity concentration in the first portion 23$a$ is higher than that in the second portion 23$b$ and a third portion 23$c$. The first portion 23$a$ of the predetermined depth range substantially in a center of the second buffer region 12 and in which the impurity concentration is relatively high is a portion from a predetermined depth position (hereinafter, gradient changing point: first depth position) 41$a$ relatively close to an interface (first interface) 27 between the second buffer region 12 and the n$^-$-type drift region 2, to a predetermined depth position (gradient changing point: second depth position) 41$b$ relatively close to an interface (second interface) 26 between the first buffer region 11 and the second buffer region 12 (FIG. 3).

In the depth direction, the impurity concentration distribution of the second buffer region 12 has, as a vertex portion, the first portion 23$a$ (portion between the gradient changing points 41$a$, 41$b$) of the predetermined depth range in substantially the center and in which the impurity concentration is relatively high, and in a direction to the n$^-$-type drift region 2 and a direction to the n$^+$-type starting substrate 21 from the vertex portion, the impurity concentration continuously decreases, forming a mountain-like shape. In the impurity concentration distribution of the second buffer region 12 in the depth direction, first, second, and third impurity concentration gradients 41, 42, 43 that are different from one another are formed, respectively, in the first portion 23$a$ from the gradient changing point 41$a$ relatively close to the n$^-$-type drift region 2 to the gradient changing point 41$b$ relatively close to the n$^+$-type starting substrate 21, the second portion 23$b$ from the gradient changing point 41$a$ relatively close to the n$^-$-type drift region 2 to the interface 27 between the second buffer region 12 and the n$^-$-type drift region 2, and the third portion 23$c$ from the gradient changing point 41$b$ relatively close to the n$^+$-type starting substrate 21 to the interface 26 between the first buffer region 11 and the second buffer region 12.

In particular, the impurity concentration of the second buffer region 12 is within the range described above, whereby the impurity concentration of the second buffer region 12 continuously increases from the gradient changing point 41*a* relatively close to the n⁻-type drift region 2 to the gradient changing point 41*b* relatively close to the n⁺-type starting substrate 21 and has a maximum impurity concentration at the gradient changing point 41*b*. In the impurity concentration distribution of the second buffer region 12 in the depth direction, the first impurity concentration gradient 41 (rate of increase: slope of an approximately straight line indicated by the finest dashed line in FIG. 3) by which the impurity concentration continuously increases from the gradient changing point 41*a* relatively close to the n⁻-type drift region 2 to the gradient changing point 41*b* relatively close to the n⁺-type starting substrate 21 has an absolute value that is extremely small as compared to the absolute value of the second impurity concentration gradient 42 (rate of decrease) by which the impurity concentration continuously decreases from the gradient changing point 41*a* to the n⁻-type drift region 2 and the absolute value of the third impurity concentration gradient 43 (rate of decrease) by which the impurity concentration continuously decreases from the gradient changing point 41*b* to the first buffer region 11.

The inventor confirmed that an instance in which the impurity concentration of the second buffer region 12 is lowered to about the impurity concentration of the n⁻-type drift region 2 or less, the impurity concentration of the second buffer region 12 becomes uniform in the depth direction while in an instance in which the impurity concentration of the second buffer region 12 is increased to exceed the upper limit described above, the impurity concentration of the second buffer region 12 continuously decreases by a predetermined impurity concentration gradient in a direction from the n⁻-type drift region 2 to the n⁺-type starting substrate 21. Further, it was confirmed that when the impurity concentration of the second buffer region 12 exceeds the upper limit described above, the impurity concentration difference between the second buffer region 12 and the n⁻-type drift region 2 increases, whereby stress in a semiconductor substrate 30 occurs and crystal defects (lattice defects, etc.) other than stacking faults occur.

In the embodiment, the impurity concentration of the second buffer region 12 is within the range described above and thus, in the impurity concentration distribution of the second buffer region 12 in the depth direction, the first impurity concentration gradient 41 by which the impurity concentration continuously increases from the gradient changing point 41*a* relatively close to the n⁻-type drift region 2 to the gradient changing point 41*b* relatively close to the n⁺-type starting substrate 21 is formed. In the impurity concentration distribution of the second buffer region 12 in the depth direction, the first impurity concentration gradient 41 is formed, whereby in the impurity concentration distribution of the second buffer region 12 in the depth direction, the second impurity concentration gradient 42 in a vicinity of the n⁻-type drift region 2 is smaller than the third impurity concentration gradient 43 in a vicinity of the n⁺-type starting substrate 21. As a result, stress due to the impurity concentration difference between the second buffer region 12 and the n⁻-type drift region 2 is reduced and bonding between crystal lattices is facilitated at the interface 27 between the second buffer region 12 and the n⁻-type drift region 2, whereby the occurrence of lattice defects may be suppressed.

Further, in the impurity concentration distribution of the second buffer region 12 in the depth direction, in a vicinity of the gradient changing point 41*a* that is in the second buffer region 12 and relatively close to the n⁻-type drift region 2, the impurity concentration decreases in a parabolic-shape protruding toward the high impurity concentration side (convex upwards), according to the second impurity concentration gradient 42 in the vicinity of the n⁻-type drift region 2. In a vicinity of the gradient changing point 41*b* that is in the second buffer region 12 and relatively close to the n⁺-type starting substrate 21, the impurity concentration decreases in a parabolic-shape protruding toward the high impurity concentration side, according to the third impurity concentration gradient 43 in the vicinity of the n⁺-type starting substrate 21. In the impurity concentration distribution of the second buffer region 12 in the depth direction, the impurity concentration distribution having a parabolic-shape in the vicinity of the gradient changing point 41*a* of the second impurity concentration gradient 42 that is in the vicinity of the n⁻-type drift region 2 has a small curvature and exhibits a gradual decrease of the impurity concentration as compared to the impurity concentration distribution having a parabolic-shape in the vicinity of the gradient changing point 41*b* of the third impurity concentration gradient 43 that is in the vicinity of the n⁺-type starting substrate 21.

One starting point of the second impurity concentration gradient 42 of the impurity concentration distribution of the second buffer region 12 is the gradient changing point 41*a* that is in the second buffer region 12 and relatively close to the n⁻-type drift region 2 while the other starting point is a predetermined depth position (gradient changing point) 42*a* in the n⁻-type drift region 2. Thus, the impurity concentration distribution of the n⁻-type drift region 2 exhibits continuous decrease of the impurity concentration in a direction from the interface 27 between the second buffer region 12 and the n⁻-type drift region 2 to the gradient changing point 42*a* in the n⁻-type drift region 2 by an impurity concentration gradient that is the same as the second impurity concentration gradient 42 of the impurity concentration distribution of the second buffer region 12 and a minimum impurity concentration in the n⁻-type drift region 2 at the gradient changing point 42*a*. The impurity concentration of the n⁻-type drift region 2 becomes the minimum impurity concentration uniformly in the depth direction in the n⁻-type drift region 2 in a portion thereof apart from the second buffer region 12 (portion of the n⁻-type drift region 2 farther on the left-side than is the gradient changing point 42*a*).

The other starting point of the third impurity concentration gradient 43 of the impurity concentration distribution of the second buffer region 12 is the gradient changing point 41*b* relatively close to the n⁺-type starting substrate 21 in the second buffer region 12 and the other starting point is a predetermined depth position (gradient changing point) 43*a* in the first buffer region 11. Thus, the impurity concentration distribution of the first buffer region 11 exhibits continuous decrease of the impurity concentration in a direction from the interface 26 between the first buffer region 11 and the second buffer region 12 to the gradient changing point 43*a* in the first buffer region 11 by an impurity concentration gradient that is the same as the third impurity concentration gradient 43 of the impurity concentration distribution of the second buffer region 12, a minimum impurity concentration in the first buffer region 11 at a single point, that is, the gradient changing point 43*a*, and continuous increase of the impurity concentration by a predetermined fourth impurity concentration gradient 44 in a direction from the gradient changing point 43*a* to the n⁺-type starting substrate 21.

One starting point of the fourth impurity concentration gradient 44 of the impurity concentration distribution of the first buffer region 11 is the gradient changing point 43*a* in the first buffer region 11 while the other starting point is a predetermined depth position (gradient changing point) 44*a* in the n⁺-type starting substrate 21. Thus, the impurity concentration distribution of the n⁺-type starting substrate 21 exhibits continuous increase of the impurity concentration in a direction from the interface 25 between the n⁺-type starting substrate 21 and the first buffer region 11 to the gradient changing point 44*a* by an impurity concentration gradient that is the same as the fourth impurity concentration gradient 44 of the impurity concentration distribution of the first buffer region 11 and the impurity concentration distribution of the n⁺-type starting substrate 21 exhibits a maximum impurity concentration in the n⁺-type starting substrate 21 at the gradient changing point 44*a*. The impurity concentration of the n⁺-type starting substrate 21 becomes the maximum impurity concentration uniformly in the depth direction in the n⁺-type starting substrate 21 in a portion thereof apart from the first buffer region 11 (portion of the n⁺-type starting substrate 21 farther on the right-side than is the gradient changing point 44*a*).

The interface 27 between the second buffer region 12 and the n⁻-type drift region 2 is at a depth position between the gradient changing point 41*a* that is in the second buffer region 12 and relatively close to the n⁻-type drift region 2 and the gradient changing point 42*a* that is in the n⁻-type drift region 2 (intermediate point along the second impurity concentration gradient 42). The interface 26 between the first buffer region 11 and the second buffer region 12 is at a depth position between the gradient changing point 41*b* that is in the second buffer region 12 and relatively close to the n⁺-type starting substrate 21 and the gradient changing point 43*a* that is in the first buffer region 11 (intermittent point along the third impurity concentration gradient 43). The interface 25 between the n⁺-type starting substrate 21 and the first buffer region 11 is at a depth position that is linearly symmetrical with the interface 26 between the first buffer region 11 and the second buffer region 12 with respect to the gradient changing point 43*a* in the first buffer region 11 as a reference.

Preferably, the thickness t2 of the second buffer region 12 may be, for example, in a range greater than 1 μm but less than 7 μm. When the thickness t1 of the first buffer region 11 exceeds 1 μm, the thickness t2 of the second buffer region 12 may be about 1 μm or less. A total thickness t10 of the first buffer region 11 and the second buffer region 12 (=t1+t2) is, for example, in a range of about 2 μm to 8 μm and preferably, may be as thin as possible. Reducing the total thickness t10 of the first buffer region 11 and the second buffer region 12 (particularly, reducing the thickness t2 of the second buffer region 12, which has a relatively high impurity concentration), enables reductions in material costs and reduction of warping of the silicon carbide semiconductor substrate 20 (also, the later-described semiconductor substrate 30). When the total thickness t10 of the first buffer region 11 and the second buffer region 12 is thick, exceeding the upper limit described above, roughness (unevenness) of the surface of the silicon carbide semiconductor substrate 20 increases, coverage of an insulating film is poor and, for example, leakage current between a gate and source of the SiC-MOSFET increases and thus, is undesirable.

The impurity concentration of the n⁻-type drift region 2 is, for example, in a range of about 1.0×10¹⁵/cm³ to 2.0×10¹⁶/ cm³. A thickness t3 of the n⁻-type drift region 2 is, for example, in a range of about 5 μm to 35p. On the n⁻-type drift region 2 (the n⁻-type epitaxial layer 24 of the silicon carbide semiconductor substrate 20), a p-type epitaxial layer constituting the p-type base region 4 (refer to FIG. 2) and a p-type anode region are epitaxially grown or a p-type epitaxial layer is epitaxially grown via an n-type epitaxial layer, whereby a pn junction (for example, corresponds to the pn junction 33 in the SiC-MOSFET in FIG. 2) constituting a main junction of the SiC-MOSFET (FIG. 2) and/or the pin diode (not depicted) may be formed.

The SiC-MOSFET fabricated using the silicon carbide semiconductor substrate 20 is described with reference to FIG. 2. A silicon carbide semiconductor device 10 according to the embodiment depicted in FIG. 2 is a vertical SiC-MOSFET having a trench gate structure in a front side of a semiconductor substrate (semiconductor chip) 30 that contains SiC as a semiconductor material. The semiconductor substrate 30 is an epitaxial substrate in which the epitaxial layers 31, 32 are further stacked sequentially on the n⁻-type epitaxial layer 24 of the silicon carbide semiconductor substrate 20 in FIG. 1 described above. The semiconductor substrate 30 has, as a front surface (first main surface), a main surface having the p-type epitaxial layer 32 and has, as a back surface, a main surface having the n⁺-type starting substrate 21. The n⁺-type starting substrate 21 constitutes the n⁺-type drain region 1.

As described above, the epitaxial layers 22 to 24 constitute, respectively, the first and second buffer regions 11, 12, and the n⁻-type drift region 2. The first and second buffer regions 11, 12 are provided between the n⁻-type drift region 2 and the n⁺-type starting substrate 21. The first buffer region 11 is in contact with the n⁺-type starting substrate 21. The second buffer region 12 is in contact with the n⁻-type drift region 2. In the n⁻-type epitaxial layer 31, the n-type current spreading regions 3 and the p⁺-type regions 13, 14 are each selectively provided (FIG. 2) or the n⁻-type epitaxial layer 31 constitutes the n⁻-type drift region 2 (not depicted). The p-type epitaxial layer 32 constitutes the p-type base region 4. The p-type base region 4 is provided between the front surface of the semiconductor substrate 30 and the n⁻-type drift region 2.

The trench gate structure is configured by the p-type base region (fourth semiconductor region) 4, n⁺-type source regions (fifth semiconductor regions) 5, p⁺⁺-type contact regions 6, trenches 7, gate insulating films 8, and gate electrodes 9. Between the p-type base region 4 and the n⁻-type drift region 2, the n-type current spreading regions 3 and the p⁺-type regions 13, 14 are each selectively provided at deep positions closer to the n⁺-type drain region 1 than are a bottoms of the trenches 7. The n-type current spreading regions 3 and the p⁺-type regions 13, 14 are diffused regions formed in the n⁻-type epitaxial layer 31 by ion implantation. Portions of the n⁻-type epitaxial layer 31 excluding the n-type current spreading regions 3 and the p⁺-type regions 13, 14 constitute the n⁻-type epitaxial layer 24 and the n⁻-type drift region 2.

The n-type current spreading regions 3 are a so-called current spreading layer (CSL) that reduces carrier spreading resistance. Between the trenches 7, which are adjacent to one another, the n-type current spreading regions 3 are in contact with the p-type base region 4 and the n⁻-type drift region 2 in the depth direction, reach the trenches 7 in a direction parallel to the front surface of the semiconductor substrate 30, and are in contact with the gate insulating films 8. The n-type current spreading regions 3 may be omitted. In an instance in which the n-type current spreading regions 3 are omitted, instead of the n-type current spreading regions 3, the n$^-$-type drift region 2 reaches the p-type base region 4 in a direction from the n$^+$-type drain region 1, reaches the trenches 7 in a direction parallel to the front surface of the semiconductor substrate 30, and is in contact with the gate insulating films 8.

The p$^+$-type regions 13, 14 are fixed to the potential of a later-described source electrode (first electrode) 16, depletes when the SiC-MOSFET (the silicon carbide semiconductor device 10) is off (or causes the n-type current spreading regions 3 to deplete, or both), and thus has a function of mitigating electric field applied to the gate insulating films 8 at the bottoms of the trenches 7. The p$^+$-type regions 13 are provided apart from the p-type base region 4 and face the bottoms of the trenches 7 in the depth direction. The p$^+$-type regions 13 are partially connected to the p$^+$-type regions 14 at non-depicted portions or are connected to other p-type regions and are thereby electrically connected to the source electrode 16. The p$^+$-type regions 13 may be in contact with the gate insulating films 8 at the bottoms of the trenches 7 or may be apart from the bottoms of the trenches 7.

Between the trenches 7 that are adjacent to one another, the p$^+$-type regions 14 are provided apart from the trenches 7 and the p$^+$-type regions 13. The p$^+$-type regions 14 each has a surface that faces the n$^+$-type source regions 5, is in contact with the p-type base region 4, and is electrically connected to the source electrode 16 via the p-type base region 4. The trenches 7 penetrate through the p-type epitaxial layer 32 from the front surface of the semiconductor substrate 30 in the depth direction and reach the n-type current spreading regions 3 (in an instance in which the n-type current spreading regions 3 are omitted, the n$^-$-type drift region 2). Between the trenches 7 that are adjacent to one another, the n$^+$-type source regions 5 and the p$^{++}$-type contact regions 6 are each selectively provided between the front surface of the semiconductor substrate 30 and the p-type base region 4.

The n$^+$-type source regions 5 and the p$^{++}$-type contact regions 6 are diffused regions formed in the p-type epitaxial layer 32 by ion implantation. A portion of the p-type epitaxial layer 32 excluding the n$^+$-type source regions 5 and the p$^{++}$-type contact regions 6 constitutes the p-type base region 4. The n$^+$-type source regions 5 and the p$^{++}$-type contact regions 6 reach the front surface of the semiconductor substrate 30. The n$^+$-type source regions 5 are provided closer to the trenches 7 than are the p$^{++}$-type contact regions 6 and are in contact with the gate insulating films 8 at the sidewalls of the trenches 7. The p$^{++}$-type contact regions 6 may be omitted. In an instance in which the p$^{++}$-type contact regions 6 are omitted, instead of the p$^{++}$-type contact regions 6, the p-type base region 4 reaches the front surface of the semiconductor substrate 30.

In the trenches 7, the gate electrodes 9 are provided, respectively, on the gate insulating films 8 so as to be embedded in the trenches 7. At inner walls of the trenches 7, the gate insulating films 8 are in contact with the n$^+$-type source regions 5, the p-type base region 4, and the n-type current spreading regions 3 (in an instance in which the n-type current spreading regions 3 are omitted, the n$^-$-type drift region 2). In the trenches 7, the gate electrodes 9 are provided via the gate insulating films 8. In FIG. 2, while only one unit cell (constituent unit of a device) of the MOSFET is depicted, in the semiconductor substrate 30, multiple unit cells each having the same trench gate structure are disposed adjacent to one another. An interlayer insulating film 15 is provided at the front surface of the semiconductor substrate 30 and covers the gate electrodes 9.

In contact holes of the interlayer insulating film 15, the n$^+$-type source regions 5 and the p$^{++}$-type contact regions 6 (in an instance in which the p$^{++}$-type contact regions 6 are omitted, the p-type base region 4) are exposed. The source electrode 16 is in ohmic contact with the front surface of the semiconductor substrate 30 in the contact holes of the interlayer insulating film 15 and is electrically connected to the n$^+$-type source regions 5, the p$^{++}$-type contact regions 6, and the p-type base region 4. A drain electrode (second electrode) 17 is provided in an entire area of the back surface (back surface of the n$^+$-type starting substrate 21) of the semiconductor substrate 30. The drain electrode 17 is in contact with the n$^+$-type drain region 1 (the n$^+$-type starting substrate 21) and is electrically connected to the n$^+$-type drain region 1.

Operation of the silicon carbide semiconductor device 10 according to the embodiment is described. When voltage (forward voltage) that is positive with respect to the source electrode 16 is applied to the drain electrode 17 and voltage that is at least equal to a gate threshold is applied to the gate electrodes 9, a channel (n-type inversion layer) is formed in a portion of the p-type base region 4 along the sidewalls the trenches 7. As a result, current flows through the channel in a direction from the n$^+$-type drain region 1 to the n$^+$-type source regions 5 and the SiC-MOSFET (the silicon carbide semiconductor device 10) turns on.

On the other hand, when forward voltage is applied between a source and drain and voltage that is less than the gate threshold voltage is applied to the gate electrodes 9, the pn junction (main junction) 33 between the p$^+$-type regions 13, 14, the p-type base region 4, the n-type current spreading regions 3, and the n$^-$-type drift region 2 are reverse biased, whereby the flow of the current stops and the SiC-MOSFET maintains the off state. Further, a depletion layer spreads from the pn junction 33 to the p$^+$-type regions 13, 14, whereby electric field applied to the gate insulating films 8 at the bottoms of the trenches 7 is mitigated.

Further, when the SiC-MOSFET is off and voltage that is negative with respect to the source electrode 16 is applied to the drain electrode 17, current may pass in a forward direction through a parasitic diode (body diode) formed by the pn junction 33 between the p-type base region 4, the p$^+$-type regions 13, 14, the n-type current spreading regions 3, and the n$^-$-type drift region 2. For example, the parasitic diode built into the semiconductor substrate 30 may be used as a free-wheeling diode for protecting the SiC-MOSFET itself.

Minority carriers (holes) that are injected into the n$^-$-type drift region 2 due to bipolar operation of the body diode recombine with electrons in the second buffer region 12 disposed between the n$^-$-type drift region 2 and the n$^+$-type starting substrate 21 and disappear. As a result, the amount of holes that reach BPDs present closer to the n$^+$-type starting substrate 21 than is the second buffer region 12 may be reduced and the growth of stacking faults in the epitaxial layers 22 to 24, 31, 32 may be suppressed. Thus, increase of the on-voltage Von of the SiC-MOSFET may be suppressed.

Next, a method of manufacturing the silicon carbide semiconductor device according to the embodiment is described. First, the n$^+$-type starting substrate (starting wafer) 21 containing silicon carbide as a semiconductor material is prepared. Next, at the front surface of the n$^+$-type starting substrate 21, the epitaxial layers 22 to 24, 31 that constitute the first and second buffer regions 11, 12, and the n$^-$-type drift region 2 are sequentially formed by epitaxial growth. The silicon carbide semiconductor substrate (semiconductor wafer) 20 in FIG. 1 is fabricated by the n$^+$-type starting substrate 21 and the epitaxial layers 22 to 24. Conditions (impurity concentration and the thicknesses t1 to t3) of the first and second buffer regions 11, 12 and the n$^-$-type drift region 2 are as described above. The impurity concentration of the n$^-$-type epitaxial layer 31, for example, is the same as the impurity concentration of the n$^-$-type drift region 2.

In the n$^+$-type starting substrate 21, while about 500 BPDs/cm$^2$ to 1000 BPDs/cm$^2$ are present, during the epitaxial growth, BPDs propagated from the n$^+$-type starting substrate 21 to the epitaxial layers 22 to 24, 31 are easily transformed into TEDs in the first buffer region 11 (the n-type epitaxial layer 22) that is formed by epitaxial growth first on the n$^+$-type starting substrate 21. As a result, from the n$^+$-type starting substrate 21, the number of BPDs that reach the epitaxial layers 23, 24, 31 beyond the n-type epitaxial layer 22 may be decreased. Thus, during body diode conduction in the SiC-MOSFET (the silicon carbide semiconductor device 10), the growth of stacking faults in the epitaxial layers 22 to 24, 31, 32, from BPDs as a starting point may be suppressed by recombination of minority carriers (holes) that are injected into the n$^-$-type drift region 2.

Next, by photolithography and ion implantation of a p-type impurity, the p$^+$-type regions 13 and lower portions (portions thereof facing the n$^+$-type drain region 1) of the p$^+$-type regions 14 are each selectively formed in surface regions of the n$^-$-type epitaxial layer 31 so as to repeatedly alternate one another and be apart from one another. Further, by photolithography and ion implantation of an n-type impurity, lower portions of the n-type current spreading regions 3 are formed in surface regions of the n$^-$-type epitaxial layer 31, between the p$^+$-type regions 13 and the p$^+$-type regions 14 that are adjacent to one another. A portion of the n$^-$-type epitaxial layer 31 closer to the n$^+$-type starting substrate 21 than are the p$^+$-type regions 13, 14 and the n-type current spreading regions 3 constitutes the n$^-$-type drift region 2.

Next, epitaxial growth is further performed so that the n$^-$-type epitaxial layer 31 has a predetermined thickness. Next, in the portion of the n$^-$-type epitaxial layer 31 where the thickness is increased, upper portions (portions facing the n$^+$-type source regions 5) of the p$^+$-type regions 14 are selectively formed by photolithography and ion implantation of a p-type impurity. Further, by photolithography and ion implantation of an n-type impurity, upper portions of the n-type current spreading regions 3 are formed in the portion of the n$^-$-type epitaxial layer 31 where the thickness is increased. The upper portions of the p$^+$-type regions 14 and the upper portions of the n-type current spreading regions 3 are formed, respectively, at positions facing, in the depth direction, the lower portions of the p$^+$-type regions 14 and the lower portions of the n-type current spreading regions 3, and are connected with the lower portions of the p$^+$-type regions 14 and the lower portions of the n-type current spreading regions 3, respectively.

Next, the p-type epitaxial layer 32 constituting the p-type base region 4 is epitaxially grown (deposited) on the n$^-$-type epitaxial layer 31. By the processes up to here, the semiconductor substrate (semiconductor wafer) 30 in which the epitaxial layers 22 to 24, 31, 32 are sequentially stacked on the front surface of the n$^+$-type starting substrate 21 is fabricated. Next, photolithography and ion implantation are performed repeatedly under different conditions, whereby the n$^+$-type source regions 5 and the p$^{++}$-type contact regions 6 are formed, respectively, in surface regions of the p-type epitaxial layer 32. A portion of the p-type epitaxial layer 32 closer to the n$^-$-type epitaxial layer 31 than are the n$^+$-type source regions 5 and the p$^{++}$-type contact regions 6 constitutes the p-type base region 4.

Next, a heat treatment is performed for activating the impurities in all diffused regions (the p$^+$-type regions 13, 14, the n-type current spreading regions 3, the n$^+$-type source regions 5, and the p$^{++}$-type contact regions 6) formed by ion implantation. The heat treatment may be performed each time a diffused region is formed. Next, the trenches 7, which penetrate through the n$^+$-type source regions 5 and the p-type base region 4 and reach the n-type current spreading regions 3, are formed by photolithography and etching. Next, the gate insulating films 8, the gate electrodes 9, the interlayer insulating film 15, the source electrode 16, and the drain electrode 17 are formed by a general method. Thereafter, the semiconductor wafer (the semiconductor substrate 30) is diced (cut) into individual chips, whereby the silicon carbide semiconductor device 10 depicted in FIG. 2 is completed.

As described, according to the embodiment, the silicon carbide semiconductor substrate is formed by sequentially forming the epitaxial layers that constitute the first and second buffer regions and the n$^-$-type drift region on the n$^+$-type starting substrate, by epitaxial growth. The impurity concentration of the first buffer region is higher than the impurity concentration of the n$^-$-type drift region and lower than the impurity concentration of the n$^+$-type starting substrate. The impurity concentration of the second buffer region is higher than the impurity concentration of the first buffer region. The n-type epitaxial layer that constitutes the first buffer region is formed first on the n$^+$-type starting substrate by epitaxial growth, whereby during epitaxial growth, BPDs propagated to the epitaxial layers from the n$^+$-type starting substrate may be transformed into TEDs at a relatively high rate and thus, the growth of stacking faults having the BPD as starting points may be suppressed.

The impurity concentration of the second buffer region continuously increases by the first impurity concentration gradient from the predetermined first depth position that is relatively close to the first interface between the second buffer region and the n$^-$-type drift region to the predetermined second depth position that is relatively close to the second interface between the first buffer region and the second buffer region, has a maximum impurity concentration value at the second depth position, continuously decreases by the second impurity concentration gradient from the first depth position to the first interface, and continuously decreases from the second depth position to the second interface by the third impurity concentration gradient. In the impurity concentration distribution of the second buffer region, the rate of decrease (second impurity concentration gradient) of the impurity concentration in a portion relatively closer to the n$^-$-type drift region is smaller than the rate of decrease (third impurity concentration gradient) of the impurity concentration in a portion relatively closer to the first buffer region (the n$^+$-type starting substrate).

The second buffer region is provided between the n$^-$-type drift region and the n$^+$-type starting substrate, whereby the temporal occurrence of stacking faults due to use of the silicon carbide semiconductor device may be suppressed. The second buffer region is provided, whereby even when the n-type impurity concentration is high between the n$^-$-type drift region and the n$^+$-type starting substrate, in the impurity concentration distribution of the second buffer region, the first to third impurity concentration gradients described above are formed, whereby the rate of decrease (second impurity concentration gradient) of the impurity concentration in a portion of the second buffer region relatively closer to the $n^-$-type drift region is gradual and stress generated in the semiconductor substrate due to the impurity concentration difference between the second buffer region and the $n^-$-type drift region may be reduced. As a result, the occurrence of lattice defects in a vicinity of the first interface between the second buffer region and the $n^-$-type drift region may be suppressed.

The first to third impurity concentration gradients of the impurity concentration distribution of the second buffer region are formed by lowering the impurity concentration of the second buffer region to be in a range from about $1.0 \times 10^{18}/cm^3$ to $5.0 \times 10^{18}/cm^3$. Further, the impurity concentration of the second buffer region is lowered to be in this range, whereby controllability of the impurity concentration of the epitaxial growth of the second buffer region is enhanced and variation of the impurity concentration of the second buffer region in the depth direction is suppressed and thus, fluctuation of the on-voltage may be suppressed. Accordingly, by providing the second buffer region, the temporal occurrence of stacking faults may be suppressed and the impurity concentration of the second buffer region is set to be in the range described above, whereby the occurrence of lattice defects due to providing the second buffer region, which has a relatively high impurity concentration, and fluctuations of the Von may be suppressed, whereby reliability may be enhanced.

A relationship between the impurity concentration and the thicknesses t1, t2 of the first and second buffer regions 11, 12 and the on-voltage Von was verified. FIG. 4 is a graph depicting the relationship between the impurity concentrations and the thicknesses of the first and second buffer regions and the on-voltage Von in an experimental example. According to the silicon carbide semiconductor device 10 of the described embodiment, multiple test samples (SiC-MOSFETs) each having different design conditions (16 conditions: hereinafter, test samples No. 1 to No. 16) for the impurity concentrations and the thicknesses t1, t2 of the first and second buffer regions 11, 12 (a predetermined number of each of the multiple test samples) were fabricated (hereinafter, experimental example). After forward current under the same condition ($1000$ $A/cm^2$) was passed through the body diodes of all the test samples, the on-voltage Von of the SiC-MOSFET was measured.

For each of the test samples of the various conditions, results of verification of the rate of fluctuation (hereinafter, Von fluctuation rate) from the design value (on-voltage Von expected under the various design conditions of the test samples) of the on-voltage Von are shown in FIG. 4. In FIG. 4, an instance in which the Von fluctuation rate of all the test samples of the same conditions is less than 1% is as assumed to have a high effect of suppressing variation of the on-voltage Von (hereinafter, effect of suppressing Von fluctuation) ("○" symbol). An instance in which the Von fluctuation rate for all the test samples of the same conditions is less than 5% is assumed to have an effect of suppressing fluctuation of the on-voltage ("Δ" symbol). The effect of suppressing Von fluctuation is assumed to be low ("x" symbol) when the Von fluctuation rate is 5% or greater for a design condition of even one of the test samples. Under the design conditions of the test samples for which the effect of suppressing Von fluctuation is a "○" symbol or a "Δ" symbol, Von fluctuations may be suppressed within a range enabling actual use.

From the results shown in FIG. 4, it was confirmed that for test sample No. 1 (the thickness t2 of the second buffer region 12=0 μm) that is free of the second buffer region 12 and test samples No. 6, No. 10, No. 13, and No. 16 in which the thicknesses t1, t2 and the impurity concentrations of the first and second buffer regions 11, 12 are outside of the described ranges of the embodiment, the effect of suppressing Von fluctuation is low ("x" symbol). On the other hand, it was confirmed that for test samples No. 2 to No. 5, No. 7 to No. 9, No. 11, No. 12, No. 14, and No. 15 in which the thicknesses t1, t2 and the impurity concentrations of the first and second buffer regions 11, 12 are within the described ranges of the embodiment, the Von fluctuation may be suppressed to be within a range enabling actual use ("○" symbol, "Δ" symbol).

As described, it was confirmed that the thicknesses t1, t2 and the impurity concentrations of the first and second buffer regions 11, 12 of the embodiment are within the described ranges, whereby Von fluctuation may be suppressed. In particular, by satisfying the range of the impurity concentration of the second buffer region 12 of the embodiment described above, controllability of the impurity concentration of the epitaxial growth of the second buffer region 12 is enhanced and variation of the impurity concentration of the second buffer region 12 in the depth direction decreases and thus, the effect of suppressing Von fluctuation increases. Accordingly, by satisfying the range of the impurity concentration of the second buffer region 12 of the embodiment described above, rate of decrease (the second impurity concentration gradient 42, refer to FIG. 3) of the impurity concentration in the second buffer region 12 toward the $n^-$-type drift region is gradual, and the occurrence of lattice defects may be suppressed while Von fluctuation may be suppressed.

In the foregoing, without limitation to the described embodiments, the present invention may be variously modified within a range not departing from the spirit of the invention. For example, the present invention may be applied to a Schottky Barrier Diode (SBD) or an insulated gate bipolar transistor (IGBT). When the present invention is applied to an SBD, an electrode in Schottky contact with the $n^-$-type epitaxial layer of the silicon carbide semiconductor substrate in FIG. 1 suffices to be formed. When the present invention is applied to an IGBT, instead of the $n^+$-type starting substrate, a $p^+$-type starting substrate suffices to be used. Further, instead of the trench gate structure, the structure may be a planar structure. Further, while the first conductivity type is described as an n-type and the second conductivity type is described as a p-type, without limitation hereto, the present invention is similarly implemented when the conductivity types (n-type, p-types) are reversed.

According to the invention described above, the third semiconductor region is provided, whereby the temporal occurrence of stacking faults may be suppressed. In the impurity concentration distribution of the third semiconductor region, the first to third impurity concentration gradients are formed, whereby the rate of decrease (second impurity concentration gradient) of the impurity concentration of the third semiconductor region toward the first semiconductor region is gradual and the stress generated in the semiconductor substrate due to the impurity concentration difference of the third semiconductor region and the first semiconductor region may be reduced. Thus, the occurrence of lattice defects in a vicinity of the first interface between the third semiconductor region and the first semiconductor region may be suppressed.

The silicon carbide semiconductor device and the silicon carbide semiconductor substrate according to the present invention achieve an effect in that reliability may be enhanced.

As described, the silicon carbide semiconductor device and the silicon carbide semiconductor substrate according to the present invention are useful for power semiconductors used in power converting equipment, power source devices of various industrial machines, etc. and are particularly suitable for SiC-MOSFETs and pin diodes.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate in which an epitaxial layer is epitaxially grown on a starting substrate containing silicon carbide, and a current flows through the semiconductor substrate in a direction orthogonal to a first main surface of the semiconductor substrate;
a first semiconductor region of a first conductivity type, provided in the epitaxial layer;
a second semiconductor region of the first conductivity type, provided in the epitaxial layer between the first semiconductor region and the starting substrate, the second semiconductor region being in contact with the starting substrate and having an impurity concentration that is higher than an impurity concentration of the first semiconductor region and lower than an impurity concentration of the starting substrate; and
a third semiconductor region of the first conductivity type, provided in the epitaxial layer between the first semiconductor region and the second semiconductor region, the third semiconductor region being in contact with the first semiconductor region and the second semiconductor region and having an impurity concentration that is higher than the impurity concentration of the second semiconductor region and lower than the impurity concentration of the starting substrate, wherein
the impurity concentration of the third semiconductor region:
continuously increases by a first impurity concentration gradient from a first depth position that is relatively close to a first interface between the third semiconductor region and the first semiconductor region to a second depth position that is relatively close to a second interface between the second semiconductor region and the third semiconductor region, and has a maximum impurity concentration at the second depth position,
continuously decreases by a second impurity concentration gradient from the first depth position to the first interface, and
continuously decreases by a third impurity concentration gradient from the second depth position to the second interface, and
the second impurity concentration gradient is lower than the third impurity concentration gradient.

2. The silicon carbide semiconductor device according to claim 1, wherein
an absolute value of the first impurity concentration gradient is less than an absolute value of the second impurity concentration gradient and an absolute value of the third impurity concentration gradient.

3. The silicon carbide semiconductor device according to claim 1, wherein
the impurity concentration of the third semiconductor region is one half or less of the impurity concentration of the starting substrate.

4. The silicon carbide semiconductor device according to claim 1, wherein
the impurity concentration of the third semiconductor region is in a range of $1.0 \times 10^{18}/cm^3$ to $5.0 \times 10^{18}/cm^3$.

5. The silicon carbide semiconductor device according to claim 4, wherein
the impurity concentration of the third semiconductor region is $3.0 \times 10^{18}/cm^3$ or greater.

6. The silicon carbide semiconductor device according to claim 1, wherein
the impurity concentration of the starting substrate is in a range of $1.0 \times 10^{18}/cm^3$ to $1.0 \times 10^{19}/cm^3$.

7. The silicon carbide semiconductor device according to claim 1, wherein
the impurity concentration of the second semiconductor region is in a range of $0.5 \times 10^{18}/cm^3$ to $1.5 \times 10^{18}/cm^3$.

8. The silicon carbide semiconductor device according to claim 1, wherein
a thickness of the third semiconductor region is more than 1 μm but less than 7 μm.

9. The silicon carbide semiconductor device according to claim 8, wherein
a thickness of the second semiconductor region is more than 1 μm but not more than 4 μm.

10. The silicon carbide semiconductor device according to claim 8, wherein
a thickness of the second semiconductor region is 1 μm or less.

11. The silicon carbide semiconductor device according to claim 1, wherein
the thickness of the second semiconductor region is more than 1 μm but not more than 4 μm.

12. The silicon carbide semiconductor device according to claim 11, wherein
a thickness of the third semiconductor region is 1 μm or less.

13. The silicon carbide semiconductor device according to claim 1, wherein
a total thickness of the second semiconductor region and the third semiconductor region is in a range of 2 μm to 8 μm.

14. The silicon carbide semiconductor device according to claim 1, further comprising:
a fourth semiconductor region of a second conductivity type, provided in the epitaxial layer between the first main surface of the semiconductor substrate and the first semiconductor region;
a fifth semiconductor region of the first conductivity type, selectively provided in the epitaxial layer between the first main surface of the semiconductor substrate and the fourth semiconductor region;
a gate insulating film provided in contact with a region of the fourth semiconductor region, between the first semiconductor region and the fifth semiconductor region;
a gate electrode provided facing the fourth semiconductor region with the gate insulating film intervening therebetween;
a first electrode provided at the first main surface formed by the epitaxial layer of the semiconductor substrate, the first electrode being electrically connected to the fourth semiconductor region and the fifth semiconductor region; and a second electrode provided at a second main surface formed by the starting substrate of the semiconductor substrate, the second electrode being electrically connected to the starting substrate.

15. A silicon carbide semiconductor substrate, comprising:

a starting substrate containing silicon carbide;

an epitaxial layer epitaxially grown on the starting substrate;

a first semiconductor region of a first conductivity type, provided in the epitaxial layer;

a second semiconductor region of the first conductivity type, provided in the epitaxial layer between the first semiconductor region and the starting substrate, the second semiconductor region being in contact with the starting substrate and having an impurity concentration that is higher than an impurity concentration of the first semiconductor region and lower than an impurity concentration of the starting substrate; and a third semiconductor region of the first conductivity type, provided in the epitaxial layer between the first semiconductor region and the second semiconductor region, the third semiconductor region being in contact with the first semiconductor region and the second semiconductor region and having an impurity concentration that is higher than the impurity concentration of the second semiconductor region and lower than the impurity concentration of the starting substrate, wherein the impurity concentration of the third semiconductor region:

continuously increases by a first impurity concentration gradient from a first depth position that is relatively close to a first interface between the third semiconductor region and the first semiconductor region to a second depth position that is relatively close to a second interface between the second semiconductor region and the third semiconductor region, and has a maximum impurity concentration at the second depth position, and continuously decreases by a second impurity concentration gradient from the first depth position to the first interface, and continuously decreases by a third impurity concentration gradient from the second depth position to the second interface, and the second impurity concentration gradient is lower than the third impurity concentration gradient.

* * * * *